(12) United States Patent
Jung et al.

(10) Patent No.: US 12,235,287 B2
(45) Date of Patent: Feb. 25, 2025

(54) SUBSTRATE PROCESSING APPARATUS

(71) Applicant: Samsung Electronics Co., Ltd., Suwon-si (KR)

(72) Inventors: Daesung Jung, Pohang-si (KR); Myeongock Ko, Hwaseong-si (KR); Meehyun Lim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 192 days.

(21) Appl. No.: 17/930,819

(22) Filed: Sep. 9, 2022

(65) Prior Publication Data
US 2023/0168278 A1 Jun. 1, 2023

(30) Foreign Application Priority Data

Nov. 29, 2021 (KR) .................. 10-2021-0167057

(51) Int. Cl.
G01R 1/07 (2006.01)
G01R 1/04 (2006.01)
(Continued)

(52) U.S. Cl.
CPC ........... *G01R 1/071* (2013.01); *G02B 27/283* (2013.01); *H01L 21/6833* (2013.01)

(58) Field of Classification Search
CPC . G01R 1/02; G01R 1/04; G01R 1/067; G01R 1/07; G01R 1/073; G01R 31/02;
(Continued)

(56) References Cited

U.S. PATENT DOCUMENTS 9,170,441 B2 10/2015 Yeom
9,285,409 B2 3/2016 Ahn et al.
(Continued)

FOREIGN PATENT DOCUMENTS

KR 100448941 B1 11/2004
KR 1020100114718 A 10/2010
(Continued)

OTHER PUBLICATIONS

Cecelja, Franjo, et al., "Lithium Niobate Sensor for Measurement of DC Electric Fields", IEEE Transactions on Instrumentation and Measurement, 50(2), 2001, 465-469.
(Continued)

Primary Examiner — Neel D Shah
(74) Attorney, Agent, or Firm — Myers Bigel, P.A.

(57) ABSTRACT

A substrate processing apparatus includes: a chamber configured to perform a wet process and having an internal space, a chuck in the internal spaced and being configured for loading a semiconductor substrate thereon, a probe having a end above the chuck and including an electro-optical crystal and a reflective mirror on one surface of the electro-optical crystal, a measuring unit connected to the probe and configured to provide reference light to the probe, and to detect a polarization component of reflected light reflected from the one end of the probe by the reference light, and a controller configured to calculate an amount of electrostatic charge on a surface of the semiconductor substrate from the polarization component.

20 Claims, 6 Drawing Sheets

(51) Int. Cl.
*G01R 1/067* (2006.01)
*G01R 1/073* (2006.01)
*G01R 31/20* (2006.01)
*G01R 31/28* (2006.01)
*G02B 27/28* (2006.01)
*H01L 21/683* (2006.01)

(58) Field of Classification Search
CPC ....... G01R 31/20; G01R 31/28; H01L 21/683; G02B 27/28
See application file for complete search history.

(56) References Cited

U.S. PATENT DOCUMENTS

| | | | |
|---|---|---|---|
| 2003/0154723 A1* | 8/2003 | Lin | F25B 21/02 62/3.2 |
| 2005/0199438 A1* | 9/2005 | Yakymyshyn | F16F 15/04 181/207 |
| 2013/0098392 A1 | 4/2013 | Hoffmann et al. | |
| 2020/0168478 A1 | 5/2020 | Jung et al. | |

FOREIGN PATENT DOCUMENTS

| | | |
|---|---|---|
| KR | 101296911 B1 | 8/2013 |
| KR | 1020140064444 A | 5/2014 |
| KR | 1020140084293 A | 7/2014 |
| KR | 1020200050259 A | 5/2020 |
| KR | 1020200062831 A | 6/2020 |
| KR | 1020210043125 A | 4/2021 |

OTHER PUBLICATIONS

Yang, Qing, et al., "AC/DC hybrid electric field measurement method based on Pockels effect and electric field modulation", Review of Scientific Instruments, 91: 055004, 2020, 1-8.

* cited by examiner

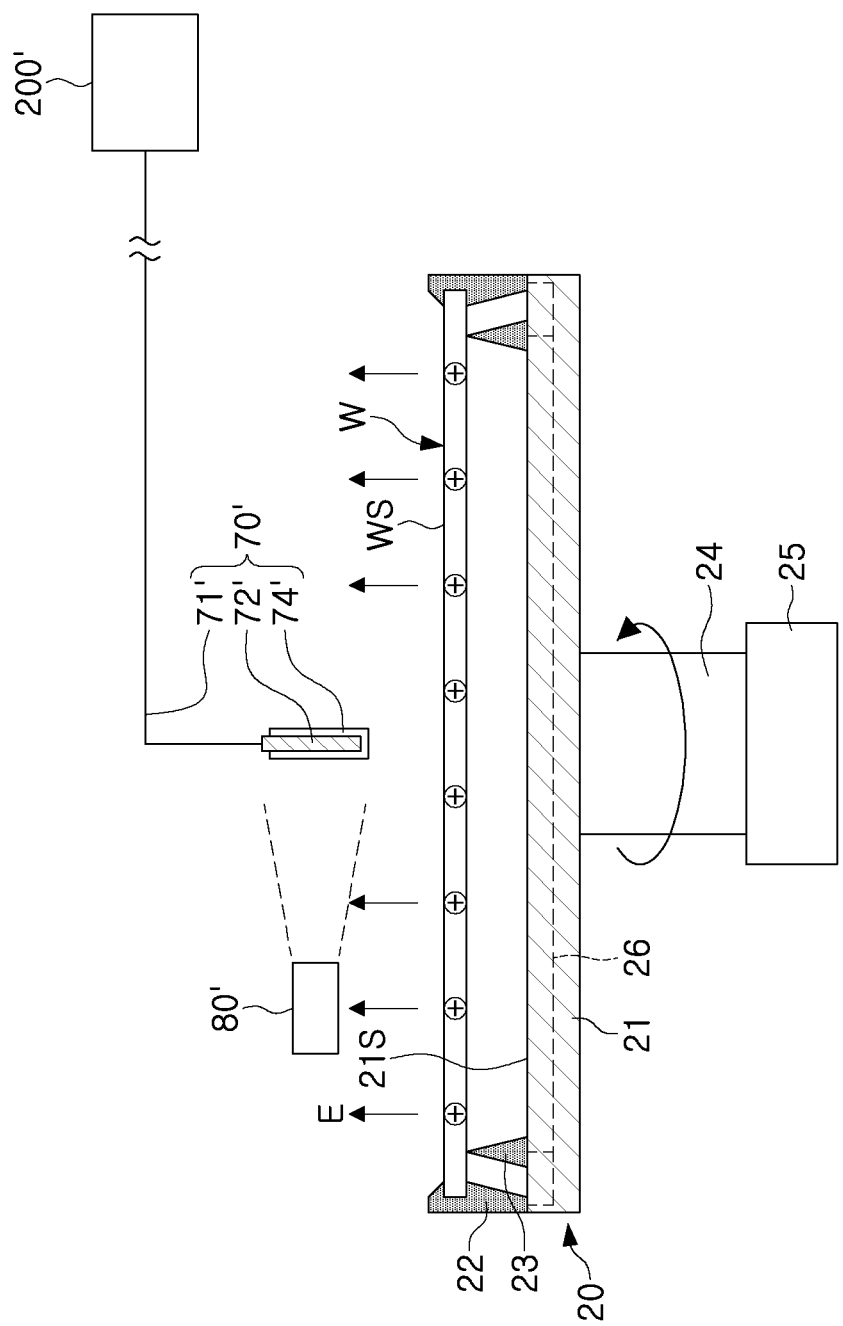

SUBSTRATE PROCESSING APPARATUS

CROSS-REFERENCE TO RELATED APPLICATION(S)

This application claims benefit of priority to Korean Patent Application No. 10-2021-0167057 filed on Nov. 29, 2021, in the Korean Intellectual Property Office, the disclosure of which is incorporated herein by reference in its entirety.

BACKGROUND

1. Field

The present inventive concept relates to a substrate processing apparatus.

2. Description of Related Art

As a degree of integration of a semiconductor device increases and as widths of lines formed during manufacturing of the semiconductor devices decrease (or, in other words, the lines become increasingly fine), resistance to static electricity of the semiconductor device is gradually decreased. Accordingly, there is an increasing problem of defects occurring in the semiconductor device due to static electricity generated during a manufacturing process of the semiconductor device. In order to reduce or prevent problems caused by static electricity, various measurement methods for measuring an amount of electrostatic charge generated in a process of manufacturing a semiconductor device have been tried. However, in the process of manufacturing a semiconductor device, an indirect method such as estimating an amount of electrostatic charge based on a distribution of film quality formed on a wafer is used, so it is difficult to accurately measure the amount of electrostatic charge. Therefore, methods are increasingly desired that are capable of more accurately measuring the amount of electrostatic charge applied to the wafer during the manufacturing process of the semiconductor device.

SUMMARY

An aspect of the present inventive concept is to provide a solid-state driving device having improved heat emissions, and a computer server system including the solid-state driving device.

According to an aspect of the present inventive concept, a substrate processing apparatus, includes: a chamber having an internal space configured for performance of a wet process therein, a chuck in a lower region of the internal space, a probe having one end above an upper portion of the chuck, and including an electro-optical crystal having an optical refractive index configured to change in proportion to a magnitude of an electric field applied at an upper portion of a semiconductor substrate loaded on the chuck, and a reflective mirror on one surface of the electro-optical crystal, a measuring unit connected to the probe, the measuring unit being configured to provide reference light to the probe, and to detect a polarization component of reflected light from the reference light that is reflected from the reflective mirror of the probe, and a controller configured to calculate an amount of electrostatic charge on a surface of the semiconductor substrate from the polarization component detected by the measuring unit.

According to an aspect of the present inventive concept, a substrate processing apparatus, includes: a chamber configured to perform a wet process and having an internal space, a chuck in a lower region of the inner space and configured to rotate a semiconductor substrate seated on an upper surface thereof, a probe having an end above an upper portion of the chuck, and configured to output an optical signal or an electric signal in response to a magnitude of an electric field applied to an upper portion of the semiconductor substrate, a measuring unit connected to the probe, and configured to detect a change in an amount of the electric field based on the optical signal or the electric signal output from the probe, and a controller configured to calculate an amount of electrostatic charge on a surface of the semiconductor substrate from the amount of change of the electric field detected by the measuring unit.

According to an aspect of the present inventive concept, a substrate processing apparatus includes: a chamber configured to perform a wet process and having an internal space, a chuck in a lower region of the internal space and configured to rotate a semiconductor substrate seated on an upper surface thereof, a probe having an end above an upper portion of the chuck, and including an electro-optical crystal having an optical refractive index configured to change in proportion to a magnitude of an electric field applied to an upper portion of the semiconductor substrate, and a reflective mirror on a surface of the electro-optical crystal, a measuring unit connected to the probe, the measuring unit being configured to provide a reference light to the probe, and to detect a polarization component of reflected light that is reflected from the reflective mirror of the probe, a charge controller including a variable resistor connected between the chuck and a ground electrode of the chuck in series, and a main controller configured to calculate an amount of electrostatic charge on a surface of the semiconductor substrate from the polarization component detected by the measuring unit, to compare the amount of electrostatic charge with a reference value, and to control variable the resistor of the charge controller so that the amount of electrostatic charge matches a reference value.

BRIEF DESCRIPTION OF DRAWINGS

The above and other aspects, features, and potential advantages of the present disclosure will be more clearly understood from the following detailed description, taken in conjunction with the accompanying drawings, in which:

FIG. 6 is a modified example of a main configuration of the substrate processing apparatus of FIG. 2.

DETAILED DESCRIPTION

Hereinafter, embodiments of the present inventive concept will be described with reference to the accompanying drawings.

Figure 1:
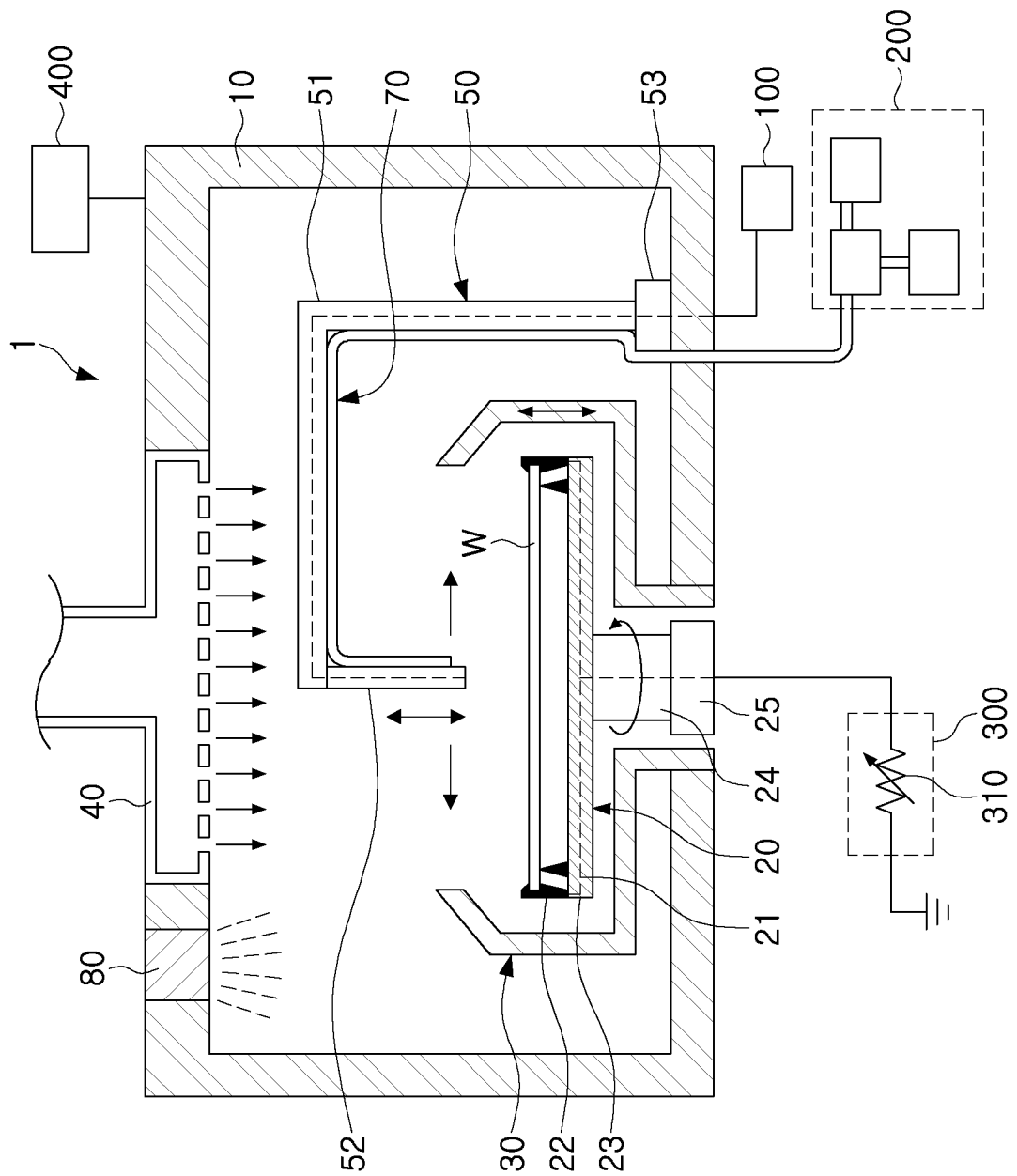
FIG. 1 is a diagram schematically illustrating a substrate processing apparatus according to an example embodiment of the present inventive concept.
Figure 2:
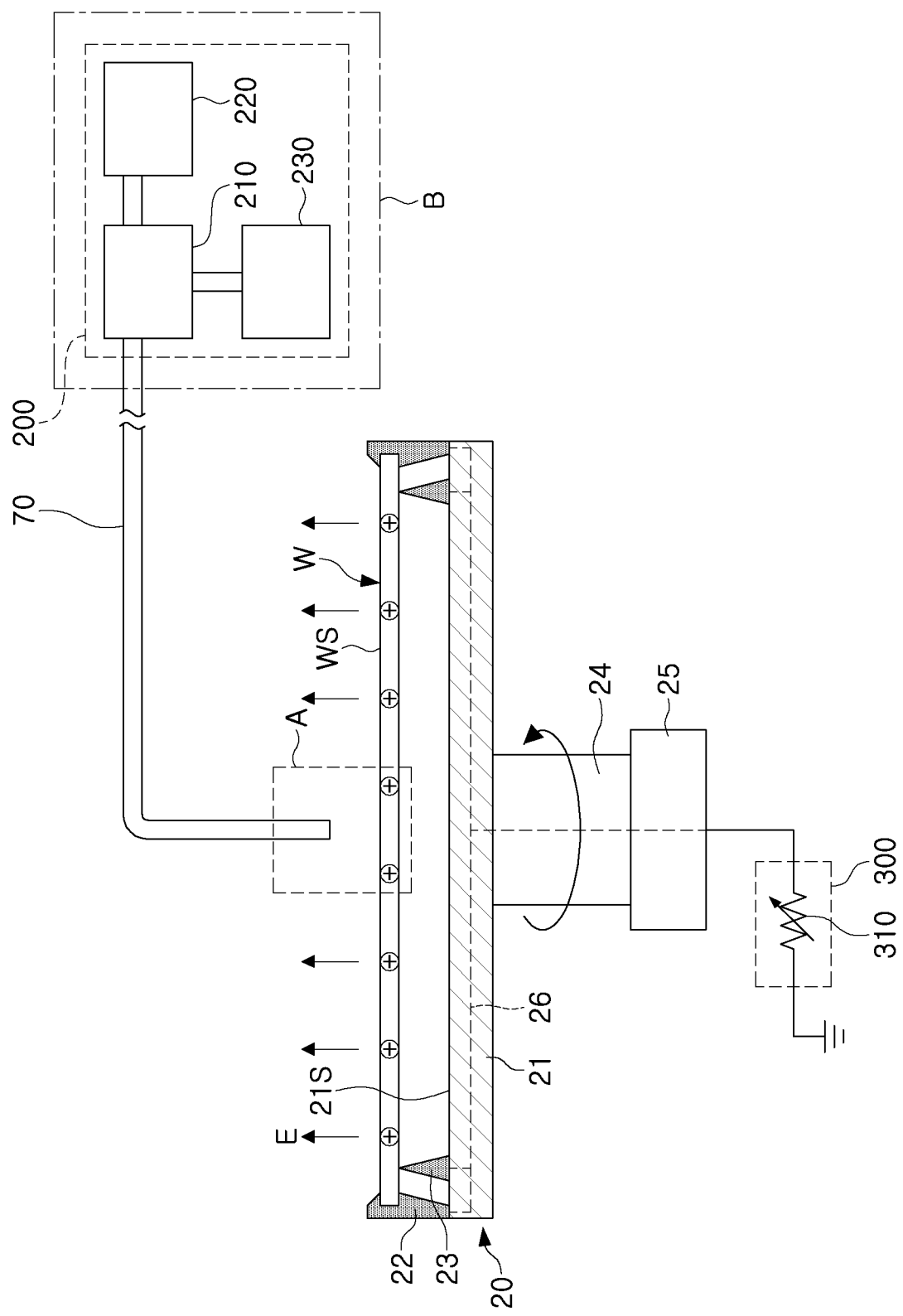
FIG. 2 is a diagram schematically illustrating a main configuration of the substrate processing apparatus of FIG. 1.
Figure 5:
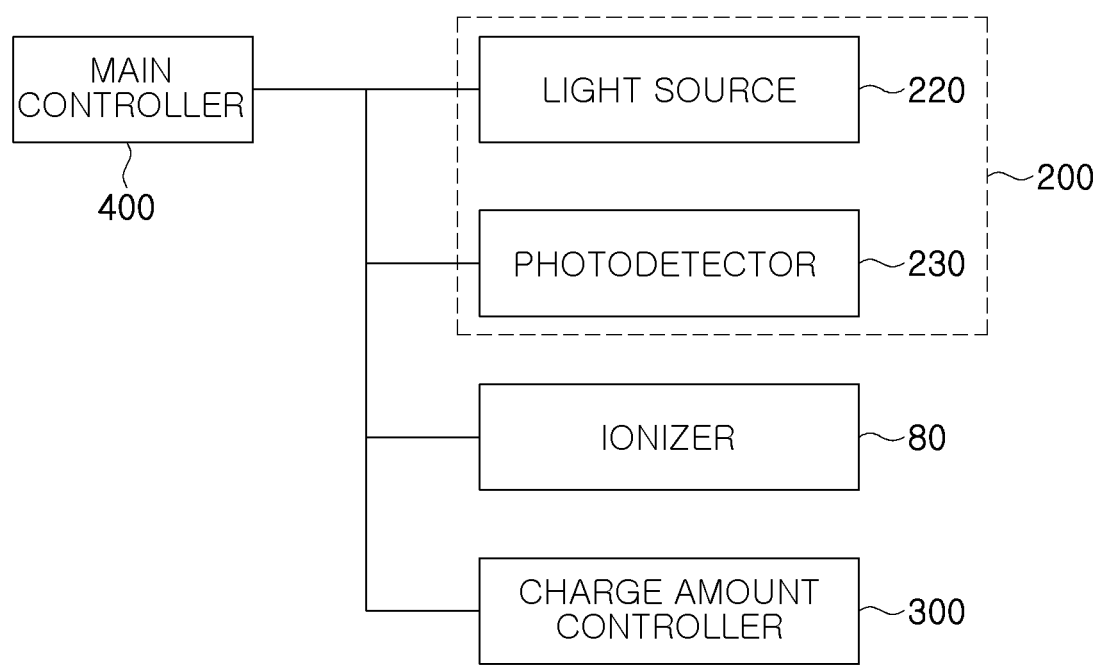
FIG. 5 is a block diagram of a substrate processing apparatus.

A substrate processing apparatus 1 according to an example embodiment will be described with reference to FIGS. 1, 2 and 5. FIG. 1 is a diagram schematically illustrating a substrate processing apparatus according to an example embodiment of the present inventive concept, and FIG. 2 is a diagram schematically illustrating a main configuration of the substrate processing apparatus of FIG. 1. FIG. 5 is a block diagram of a substrate processing apparatus.

Referring to FIGS. 1 and 2, a substrate processing apparatus 1 may include a chamber 10, a chuck 20, a probe 70, a measuring unit 200, and a main controller 400. In addition, the substrate processing apparatus 1 may further include a charge controller 300 and an ionizer 80. In addition, the substrate processing apparatus 1 may further include a bowl 30, a chemical solution supply unit 50, a chemical solution supply source 100, and an airflow generator 40. According to an example embodiment, the measuring unit 200 and the main controller 400 may be outside the chamber 10.

Referring to FIGS. 1 and 5, the main controller 400 may control an overall operation of the substrate processing apparatus 1 and may control each configuration of the substrate processing apparatus 1. For example, the main controller 400 may control operations of a light source 220 and a photodetector 230, included in the measuring unit 200, the ionizer 80, and the charge controller 300. The main controller 400 may be outside the substrate processing apparatus 1. For example, the main controller 400 may be implemented with a processor such as a central processing unit (CPU), a graphic processing unit (GPU), a microprocessor, an application specific integrated circuit (ASIC), a field programmable gate arrays (FPGA), or the like. In addition, the main controller 400 may include a memory for storing various data necessary for the operation of the substrate processing apparatus 1.

The chamber 10 may provide an internal space in which a wafer W, a semiconductor substrate, is processed. In the case of an example embodiment, a process of wet processing the wafer W may be performed in the internal space of the chamber 10. For example, any one of processes of a cleaning process for cleaning the wafer W, a photo spinner process or a chemical mechanical polishing process for applying a chemical to the wafer W may be performed in the internal space of the chamber 10. In an example embodiment, a case in which the photo spinner process is performed in the chamber 10 will be described as an example.

The chuck 20 may be in a lower region of the internal space of the chamber 10, and the wafer W may be loaded on an upper surface 21S thereof. The chuck 20 may be supported by a driving shaft 24, and the driving shaft 24 may be connected to a driving unit 25 to rotate at a high speed. The chuck 20 may include a plate 21, a support pin 23 in an upper portion of the plate 21, to support the wafer W, a gripper 22 at an edge of the plate 21, to hold or secure the edge of the wafer W in a fixed position, and a ground path 26 inside the plate 21 and configured to connect the support pin 23 and the gripper 22 to a ground electrode. A bowl may be around the chuck 20 to reduce or prevent a chemical from scattering in a process of processing the wafer W. Static electricity may be accumulated while the wafer W loaded on the chuck 20 is rotated at a high speed by the chuck 20. The static electricity accumulated in the wafer W may damage the wafer W by generating an electrostatic discharge (ESD) in the wafer W in the process of processing the wafer W. In addition, an unintended problem, such as particles being adsorbed on the wafer W due to static electricity, may occur.

An airflow generator 40 may be above the chuck 20. The airflow generator 40 may be in an upper region of the chamber 10 to form a generally uniform airflow from the upper portion of the chamber 10 toward an upper surface 21S of the chuck 20. Accordingly, it is possible to reduce or prevent a chemical solution sprayed from the chemical solution supply unit 50 from scattering out of the bowl 30. In addition, the ionizer 80 may be on the upper portion or a side surface of the chamber 10, and discharge ions into an internal space of the chamber 10 to remove or reduce static electricity. Accordingly, the ionizer 80 may remove or reduce static electricity charged to each component of the substrate processing apparatus 1 such as the bowl 30, the chuck 20, and the other components in the internal space of the chamber 10, to improve accuracy of a process of measuring the amount of an electrostatic charge charged in the wafer W. When the ionizer 80 is in the upper portion of the chamber 10, ions emitted from the ionizer 80 may be uniformly attached to the wafer W using airflow of the airflow generator 40.

The chemical solution supply unit 50 may spray a chemical solution supplied from a chemical solution supply source 100 to the wafer W. The chemical solution supply unit 50 may include a nozzle 52 and a support 51. The support 51 may move vertically and horizontally on the wafer W by a driving unit 53. The nozzle 52 may be at an end portion of the support 51, and an end portion of the nozzle 52 may be at a level that is lower than that of an upper portion of the bowl 30.

The probe 70 may be above the upper portion of the chuck 20 so that one end thereof faces the wafer W, and the other end of the probe 70 may be connected to the measuring unit 200. The probe 70 may be attached to the nozzle 52 of the chemical solution supply unit 50, but an example embodiment thereof is not limited thereto, and may be attached to a separate support. The probe 70 may output an optical signal or an electrical signal corresponding to a magnitude of the electric field E applied to the upper portion of the chuck 20. In the case of an example embodiment, a case in which an optical signal is output from the probe 70 will be described as an example.

Figure 3:
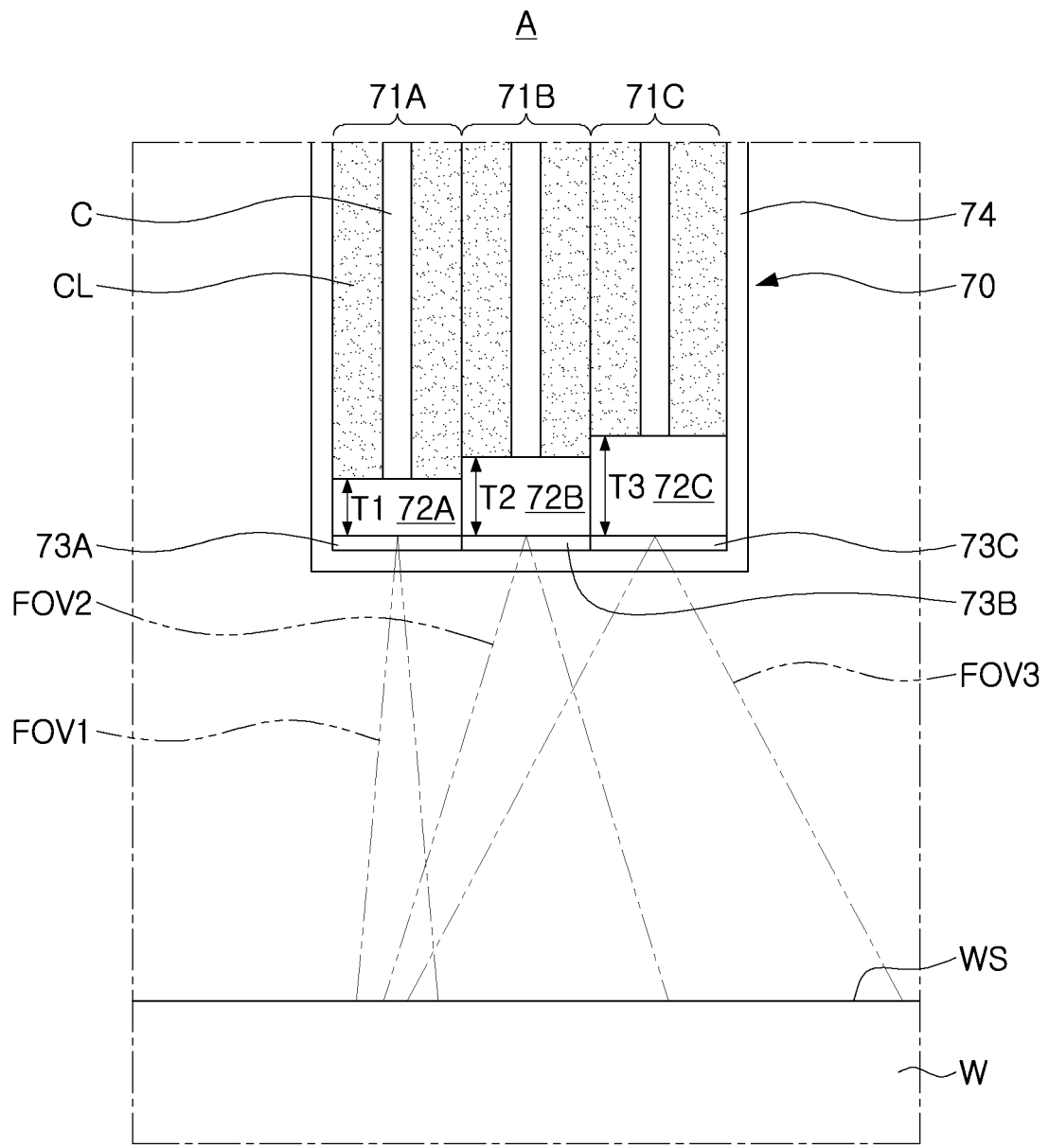
FIG. 3 is an enlarged view of part A of FIG. 2.

Referring to FIG. 3, the probe 70 in an example embodiment may include an optical cable 71, an electro-optical crystal 72 at an end portion of the optical cable 71, and a reflective mirror 73 on a surface of the electro-optical crystal 72. A chemical resistant resin layer 74 may be on the probe 70, and in some embodiments, the chemical resistant resin layer may coat the probe 70 so as to completely cover an exterior surface of the probe 70, so that when the probe 70 is used to detect static electricity, an impact of various chemical materials inside the chamber 10 may be minimized. The chemical resistant resin layer 74 may be formed of at least one of perfluoroalkoxy (PFA), polytetrafluoroethylene (PTEE), and ethylene tetrafluoroethylene (ETFE).

Figure 4B:
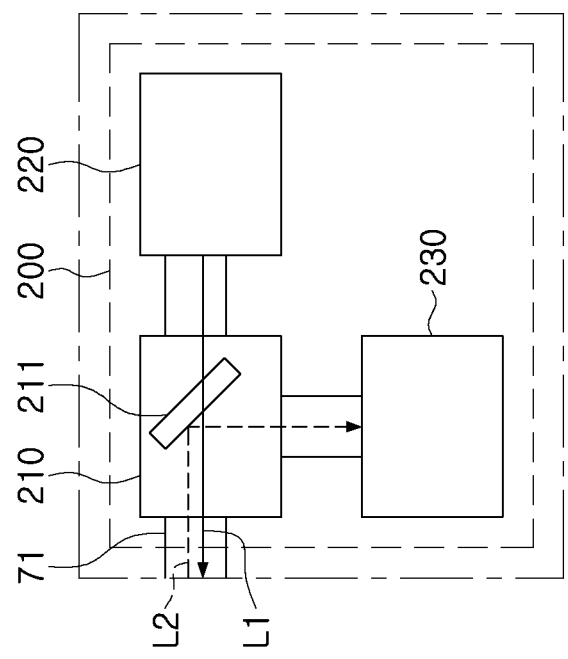
FIGS. 4A and 4B are diagrams for illustrating a static electricity measurement method performed in parts A and B of FIG. 2.
Figure 4A:
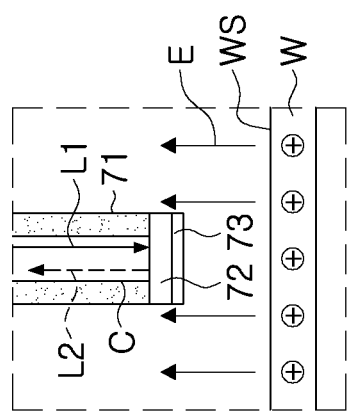

The optical cable 71 may include at least one polarization maintaining fiber 71A. The polarization maintaining fiber 71A may include a core C and a cladding CL surrounding a side surface of the core C. An electro-optical crystal 72 and a reflective mirror 73 may be sequentially stacked in an end portion of the polarization maintaining fiber 71A. The electro-optical crystal 72 may be formed of a material with an associated optical refractive index that changes according to an intensity of the applied electric field E. For example, the electro-optical crystal 72 may be made of lithium niobate ($LiNbO_3$). The reflective mirror 73 may reflect light passing through the electro-optical crystal 72 to the electro-optical crystal 72. Therefore, as illustrated in FIGS. 4A and 4B, light propagated through the optical cable 71 in the measuring unit 200 (hereinafter, referred to as 'reference light (L1)') may pass through the electro-optical crystal 72, be first rotationally polarized, and then be reflected by the reflective mirror 73. Light reflected by the reflective mirror 73 (hereinafter, referred to as 'reflected light (L2)') may pass through the electro-optical crystal 72, be secondary rotationally polarized, and then be provided to the measuring unit 200. The reflected light L2 may be provided to the measuring unit 200 through the optical cable 71.

As described above, the probe 70 may rotationally polarize the reference light L1 supplied through the optical cable 71 according to the intensity of the applied electric field E to provide the same to the reflected light L2. That is, the probe 70 may be understood as a kind of static electricity sensor that rotationally polarizes the received light with a magnitude that is proportional to the intensity of the applied electric field E and outputs the same. The measuring unit 200 may detect a polarization component of the reflected light L2 output from the probe 70 and calculate the intensity of the electric field E applied to the probe 70 from the detected polarization component.

Depending on a thickness of the electro-optical crystal 72, a range of an electric field affected on the electro-optical crystal 72 may vary. For example, as the thickness of the electro-optical crystal 72 increases, it may be affected by an electric field in a relatively wide range, and as the thickness of the electro-optical crystal 72 decreases, it may be affected by an electric field in a relatively narrow range. Accordingly, by adjusting the thickness of the electro-optical crystal 72, the resolution, which is the size of the range in which the probe 70 detects the electric field E, can be adjusted. This may be understood as adjusting a field of view (FOV) of the probe 70. For example, when the thickness of the electro-optical crystal 72 is relatively thick, the probe 70 may have a wider field of view, and when the thickness of the electro-optical crystal 72 is relatively thin, the probe 70 may have a narrower field of view.

In addition, the optical cable 71 may be formed of a plurality of polarization maintaining fibers 71A, 71B, and 71C. In this case, each of the plurality of polarization maintaining fibers 71A, 71B, and 71C may operate as an independent static electricity sensor. The plurality of polarization maintaining fibers 71A, 71B, and 71C may be configured in various forms to form one bundle, based on a cross-section of the optical cable 71. For example, the probe 70 of an example embodiment may include first to third polarization maintaining fibers 71A, 71B, and 71C, and the first to third polarization maintaining fibers 71A, 71B, and 71C may be in a line when viewed from the cross-section of the optical cable 71.

A separate reflective mirror 73 may be at an end portion of each of the plurality of polarization maintaining fibers 71A, 71B, and 71C. For example, the first to third polarization maintaining fibers 71A, 71B, and 71C may include first to third electro-optical crystals 72A, 72B, and 72C and first to third reflective mirrors 73A, 73B, and 73C, respectively. In this case, the first to third electro-optical crystals 72A, 72B, and 72C may have first to third thicknesses T1, T2, and T3 that are sequentially increased, respectively. Accordingly, the probe 70 may have three different field of views FOV1, FOV2, and FOV3. As described above, by arranging a plurality of polarization maintaining fibers 71A, 71B, and 71C on one optical cable 71, the probe 70 may have a spatial resolution of various ranges.

The measuring unit 200 may detect an amount of change of the electric field applied to the upper portion of the chuck 20 based on an optical signal or an electric signal output from the probe 70. In addition, the measuring unit 200 may transmit the detected amount of change of the electric field to the main controller 400. The case in which the measuring unit 200 detects the amount of change of the electric field in the upper portion of the chuck 20 based on the optical signal output from the probe 70 will be described as an example.

The measuring unit 200 according to an example embodiment may be connected to the probe 70 to provide reference light L1 to the probe 70 and may detect a polarization component from reflected light L2 provided or detected by the probe 70. The measuring unit 200 may include a light source 220, a polarization beam splitter 210, and a photodetector 230.

The light source 220 may provide reference light L1 having a constant wavelength and phase. For example, the light source 220 may include a laser diode. The reference light L1 emitted from the light source 220 may be provided to the probe 70 through the polarization beam splitter 210.

The photodetector 230 may detect a polarization component of reflected light L2 incident through the polarization beam splitter 210 and convert the detected polarization component into an electrical signal and transmit the same to the main controller 400. For example, the photodetector 230 may include a photodiode. The main controller 400 may calculate the amount of electrostatic charge in the upper portion of the wafer W, based on data of the polarization component provided from the photodetector 230.

The polarization beam splitter 210 may be between the light source 220 and the photodetector 230. The polarization beam splitter 210 may divide the reflected light L2 provided from the probe 70 into a polarization component and other components and split the polarization component and the other components into two optical paths, to provide the same to the light source 220 and the photodetector 230, respectively. In addition, the polarization beam splitter 210 may transmit the reference light L1 provided from the light source 220 and provide the same to the probe 70. For example, the polarization beam splitter 210 may include a dichroic mirror 211.

The charge controller 300 may adjust an amount of electrostatic charge in an upper portion of a wafer W by adjusting the intensity of an electric field formed in the upper portion of the wafer W. Depending on the process, if the amount of electrostatic charge in the upper portion of the wafer W is appropriately adjusted, the efficiency of the process may be improved.

The charge controller 300 may include a variable resistor 310 therein. The charge controller 300 may be connected in series on a ground path 26 of the chuck 20, and the main controller 400 may adjust a resistance value of the variable resistor 310, to adjust the amount of electrostatic charge applied to an upper portion of the chuck 20. For example, the main controller 400 may calculate the amount of electrostatic charge on the upper portion of the chuck 20 based on the polarization component data transmitted from the measuring unit 200, compare the calculated amount of electrostatic charge with a pre-stored reference value, and adjust the resistance value of the variable resistor 310 so that the amount of electrostatic charge becomes equal to a reference value. In this case, when the calculated amount of electrostatic charge is greater than a reference value, the main controller 400 may reduce the resistance value of the variable resistor 310, to reduce an amount of charge accumulated in the upper portion of the chuck 20. When the amount of charge accumulated in the upper portion of the chuck 20 is reduced, a voltage of an electric field E applied to the upper portion of the chuck 20 may be reduced. Accordingly, the amount of electrostatic charge applied to the upper portion of the wafer W by the electric field E may also be reduced. In addition, when the calculated amount of electrostatic charge is lower than a reference value, the main controller 400 may increase the resistance value of the variable resistor 310, to increase an amount of charge accumulated in the upper portion of the chuck 20. When the amount of charge accumulated in the upper portion of the chuck 20 increases, a voltage of an electric field E applied to the upper portion of the chuck 20 may increase. Accordingly, the amount of electrostatic charge applied to the upper portion of the wafer W by the electric field E may be increased. In this way, the main controller 400 may adjust the amount of electrostatic charge applied to the upper portion of the wafer W by adjusting the resistance value of the variable resistor 310. However, according to an example embodiment, the variable resistor 310 of the charge controller 300 may be replaced with a switching element. The switching element may be on a ground path 26 to adjust a ground current flowing from the chuck 20 to a ground electrode.

With reference to FIG. 6, a modified example of a substrate processing apparatus is described. FIG. 6 illustrates a modified example of the main configuration of the substrate processing apparatus of FIG. 2.

The modified example of FIG. 6 is different from the main configuration of the substrate processing apparatus described with reference to FIG. 2 in that a probe 70' and a measuring unit 200' are different. Since other configurations are the same as those of the above-described example embodiment, detailed descriptions of analogous elements are omitted to avoid overlapping descriptions.

Referring to FIG. 6, the probe 70' according to an example embodiment may output an electrical signal corresponding to a magnitude of an electric field E applied to an upper portion of the wafer W. The probe 70' may include a conductive wire 71' and a conductor 72' at an end portion of the conductive wire 71'. The conductor 72' may be made of metal, and a chemical resistant resin layer 74' may be coated on a surface of the conductor 72', so that an influence of various chemicals inside the chamber 10 may be reduced or minimized in a process in which the probe 70' detects static electricity. The chemical resistant resin layer 74 may be formed of at least one of perfluoroalkoxy (PFA), polytetrafluoroethylene (PTEE), and ethylene tetrafluoroethylene (ETFE). An inductively charged voltage or a rush current may be applied to the conductor 72' in response to the magnitude of the electric field E. In an example embodiment, an ionizer 80' may be positioned in a lateral direction of the conductor 72'. The ionizer 80' may emit ions to the conductor 72' to remove static electricity charged on the surface of the conductor 72'.

The measuring unit 200' may detect an amount of charge of the electric field E applied to an upper portion of the wafer W based on an electric signal output from the probe 70'. In addition, the measuring unit 200' may transmit the detected change amount of the electric field to the main controller 400.

The measuring unit 200' may detect the inductively charged voltage or the rush current applied to the conductor 72' of the probe 70'.

For example, when the measuring unit 200' detects a voltage inductively charged in the conductor 72', the measuring unit 200' may transmit a voltage value that is an inductively charged voltage in the conductor 72' to the main controller 400. The main controller 400 may calculate the amount of electrostatic charge on a surface of the wafer W from the transmitted voltage value by referring to the previously stored voltage value-electrostatic charge correlation table.

For example, when the measuring unit 200' detects a rush current applied to the conductor 72', the measuring unit 200' may transmit a rush current value detected in the conductor 72' to a main controller 400. The main controller 400 may calculate an amount of electrostatic charge on a surface of the wafer W by integrating the rush current value transmitted from the measurement unit 200'.

As set forth above, according to an example embodiment of the present inventive concept, a substrate processing apparatus can accurately measure an amount of electrostatic charge applied to a semiconductor device while the semiconductor device is being produced.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second," the element is not limited thereby. They may be used only for a purpose of distinguishing the element from the other elements and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

The various and advantageous advantages and effects of the present inventive concept are not limited to the above description and may be more easily understood in the course of describing the specific embodiments of the present inventive concept.

While example embodiments have been shown and described above, it will be apparent to those skilled in the art that modifications and variations could be made without departing from the scope of the present inventive concept as defined by the following claims.

What is claimed is:

1. A substrate processing apparatus, comprising:
a chamber having an internal space configured for performance of a wet process therein;
a chuck in a lower region of the internal space;
a probe having one end above an upper portion of the chuck, and including an electro-optical crystal having an optical refractive index configured to change in proportion to a magnitude of an electric field applied at an upper portion of a semiconductor substrate loaded onto the chuck, and the probe further including a reflective mirror on one surface of the electro-optical crystal;
a measuring unit connected to the probe, the measuring unit being configured to provide reference light to the probe and to detect a polarization component of reflected light from the reference light that is reflected from the reflective mirror of the probe; and
a controller configured to calculate an amount of electrostatic charge on a surface of the semiconductor substrate from the polarization component detected by the measuring unit.

2. The substrate processing apparatus of claim 1, wherein the probe further comprises a chemical resistant resin layer on a surface of the probe.

3. The substrate processing apparatus of claim 2, wherein the chemical resistant resin layer comprises at least one of Perfluoroalkoxy (PFA), Polytetrafluoroethylene (PTEE), and Ethylene tetrafluoroethylene (ETFE).

4. The substrate processing apparatus of claim 1, wherein the probe further comprises an optical cable connecting the electro-optical crystal and the measuring unit.

5. The substrate processing apparatus of claim 4, wherein the optical cable comprises a plurality of polarization maintaining fibers,
and the electro-optical crystal includes a plurality of electro-optical crystals corresponding to respective ones of the plurality of polarization maintaining fibers.

6. The substrate processing apparatus of claim 5, wherein at least a portion of the plurality of electro-optical crystals have different thicknesses.

7. The substrate processing apparatus of claim 1, wherein the measuring unit further comprises,
a light source configured to provide the reference light;
a polarization beam splitter configured to split the reflected light; and
a photodetector at a rear end of the polarization beam splitter and configured to detect the polarization component.

8. The substrate processing apparatus of claim 7, wherein the light source comprises a laser diode.

9. The substrate processing apparatus of claim 7, wherein the polarization beam splitter is configured to split the polarization component and another component from the reflected light.

10. The substrate processing apparatus of claim 1, wherein the chuck comprises a driving shaft configured to support the chuck; and
a driving unit configured to rotate the driving shaft.

11. The substrate processing apparatus of claim 1, wherein the measuring unit and the controller are positioned outside the chamber.

12. The substrate processing apparatus of claim 1, wherein the probe is attached to a nozzle configured to move vertically and horizontally on the upper portion of the semiconductor substrate.

13. A substrate processing apparatus, comprising:
a chamber having an internal space configured for performance of a wet process therein;
a chuck in a lower region of the internal space and configured to rotate a semiconductor substrate seated on an upper surface thereof;
a probe having an end above an upper portion of the chuck, and including an electro-optical crystal having an optical refractive index configured to change in proportion to a magnitude of an electric field applied to an upper portion of the semiconductor substrate, and a reflective mirror on a surface of the electro-optical crystal;
a measuring unit connected to the probe, the measuring unit being configured to provide a reference light to the probe, and to detect a polarization component of reflected light that is reflected from the reflective mirror of the probe;
a charge controller including a variable resistor connected between the chuck and a ground electrode of the chuck in series; and
a main controller configured to calculate an amount of electrostatic charge on a surface of the semiconductor substrate from the polarization component detected by the measuring unit, to compare the amount of electrostatic charge with a reference value, and to control the variable resistor of the charge controller so that the amount of electrostatic charge matches a reference value.

14. The substrate processing apparatus of claim 13, wherein the main controller is configured to reduce a resistance value of the variable resistor when the amount of electrostatic charge is greater than the reference value, and
the main controller is configured to increase a resistance value of the variable resistor when the amount of electrostatic charge is lower than the reference value.

15. The substrate processing apparatus of claim 13, further comprising
an ionizer in an upper portion of the chamber that is configured to emit ions to the internal space.

16. The substrate processing apparatus of claim 13, wherein the chuck further comprises:
a plate;
a support pin on an upper surface of the plate that is configured to support the semiconductor substrate;
a gripper on an edge of the upper surface of the plate and configured to secure an edge of the semiconductor substrate in a fixed position; and
a ground path inside the plate and configured to connect the support pin and the gripper to the ground electrode.

17. The substrate processing apparatus of claim 13, wherein the probe further comprises a chemical resistant resin layer on a surface of the probe.

18. The substrate processing apparatus of claim 17, wherein the chemical resistant resin layer comprises at least one of Perfluoroalkoxy (PFA), Polytetrafluoroethylene (PTEE), and Ethylene tetrafluoroethylene (ETFE).

19. The substrate processing apparatus of claim 13, wherein the probe further comprises an optical cable connecting the electro-optical crystal and the measuring unit.

20. The substrate processing apparatus of claim 19, wherein the optical cable comprises a plurality of polarization maintaining fibers,
and the electro-optical crystal includes a plurality of electro-optical crystals corresponding to respective ones of the plurality of polarization maintaining fibers.

* * * * *